United States Patent [19]
Pace et al.

[11] Patent Number: 5,471,665
[45] Date of Patent: Nov. 28, 1995

[54] DIFFERENTIAL DC OFFSET COMPENSATION CIRCUIT

[75] Inventors: Gary L. Pace, Boca Raton; James D. Hughes, Boynton Beach, both of Fla.

[73] Assignee: Motorola, Inc., Schaumburg, Ill.

[21] Appl. No.: 324,634

[22] Filed: Oct. 18, 1994

[51] Int. Cl.[6] .................. H04B 1/06; H03F 3/45
[52] U.S. Cl. .............. 455/343; 330/259; 455/209
[58] Field of Search .............. 330/9, 259; 327/307; 455/208, 209, 278.1, 343

[56] References Cited

U.S. PATENT DOCUMENTS

| | | | |
|---|---|---|---|
| 3,731,215 | 5/1973 | Peil et al. | 330/259 X |
| 4,366,443 | 12/1982 | Harford | 330/259 X |
| 5,182,476 | 1/1993 | Hanna et al. | 330/9 X |
| 5,222,253 | 6/1993 | Heck . | |
| 5,241,702 | 8/1993 | Dent | 455/278.1 |

FOREIGN PATENT DOCUMENTS 2232029  11/1990  United Kingdom .

OTHER PUBLICATIONS

Remco J. Wiegerink, Evert Seevinck, Wim De Jager, "Offset Canceling Circuit" Jun. 1989 pp. 651–658, IEEE Journal of Solid-State Circuits vol. 24, No. 3.

*Primary Examiner*—James B. Mullins
*Attorney, Agent, or Firm*—D. Andrew Floam

[57] ABSTRACT

A differential direct current (DC) offset compensation circuit for providing DC offset compensation to a circuit device (110). The DC offset compensation circuit (100) comprises a differential integrator (120) and a summing network (130). The circuit device (110) is one of several types of devices, such as a DC coupled amplifier. The differential input (112) of the circuit device (110) is suitable for coupling to a differential input source (140) and the differential output (114) of the circuit device is suitable for connection to a load (150). The differential integrator (120) features a transconductance amplifier (18) at least one other amplifier (13), and a capacitor element (16) having a capacitance of C1. The summing network (130) sums the differential integrator output with the differential input signals of the differential input source (140) and cancels DC offsets of the differential input source (140) and the circuit device (110).

21 Claims, 9 Drawing Sheets

DIFFERENTIAL DC OFFSET COMPENSATION CIRCUIT

RELATED APPLICATIONS

The present application is related to the following commonly assigned application, filed on even date: Ser. No. 08/324,636.

Fully Differential Transconductance Amplifier with Common-Mode Output Voltage Stabilization, to Pace et al.

FIELD OF THE INVENTION

This invention relates to a circuit for compensating for differential direct current (DC) offsets in a differential input source and a circuit device which is coupled to the differential input source and to a load.

BACKGROUND OF THE INVENTION

In many direct current (DC) coupled amplifiers, which may include several stages, negative voltage feedback from the output to the input is used to stabilize the DC operating point such that all signal nodes remain within the linear operating range of the amplifier. A resistor-capacitor (RC) low pass filter or transconductance amplifier-capacitive integrator (in which each circuit uses a grounded capacitor) is placed in the feedback path to attenuate the loop gain at higher frequencies so that the amplifier is stable and the gain of the amplifier in the pass band is not degraded.

In some relatively low frequency applications, such as the base band filter/amplifier for a zero-intermediate frequency (zero-IF) receiver for example, it is desirable to implement the entire circuit on an integrated circuit. This reduces external parts and integrated circuit (IC) pinouts, and improves tracking between the I and Q channels of the zero-IF receiver. However, RC low pass filters can require a large amount of chip area to implement at low frequencies, which can increase chip cost. Chip area is not as much a problem with the transconductance amplifier-capacitive integrator approach since the gain of the transconductance amplifier can be lowered as necessary to achieve the desired loop corner frequency.

Both approaches suffer from a warm-up time problem in applications where the circuit is strobed ON and OFF to improve battery life, due to the need to charge the grounded capacitor to the proper DC operating point following each power-up. It is therefore desirable to provide a differential DC offset compensated amplifier circuit having a fast warm-up time in a completely integrated configuration that minimizes external parts and IC pinouts. It is additionally desirable to provide an amplifier circuit which has the capability to externally program a high pass corner frequency generated by the differential feedback loop while maintaining a fast warm-up time.

SUMMARY OF THE INVENTION

In accordance with one aspect, the present invention is directed to a differential direct current (DC) offset compensation circuit suitable for providing DC offset compensation to a circuit device, the circuit device having a differential input and a differential output, the differential input of the circuit device suitable for coupling to a differential input source of differential input signals, the differential output of the circuit device suitable for connection to a load, the differential DC offset compensation circuit comprising:

a differential integrator coupled to the differential output of the circuit device and for receiving as input output signals of the circuit device, and generating at an output a differential integrator output; and a summing network coupled to the output of the differential integrator, to the differential input source, and to the differential input of the circuit device, the summing network summing the differential integrator output with the differential input signals for canceling any DC offsets of the differential input source and of the circuit device, the summing signals coupled to the differential input of the circuit device.

According to another aspect, the present invention is directed to a combination of a receiver circuit for receiving a signal detected by an antenna, and a control circuit for controlling ON and OFF time of the receiver circuit, the receiver circuit comprising:

a radio frequency (RF) amplifier coupled to the antenna for amplifying the signal detected by the antenna and generating an amplified signal;

a mixer coupled to the RF amplifier for mixing the amplified signal with an oscillator signal of a predetermined frequency and generating at an output a mixed signal;

an amplifier stage coupled to the mixer comprising:

a first amplifier coupled to the output of the mixer for amplifying the mixed signal and generating at an output a first differential amplified signal;

a second amplifier DC coupled to the output of the first amplifier and having a predetermined frequency pass characteristic for amplifying the differential amplified signal and for generating at an output a second differential amplified signal;

a differential integrator coupled to the output of the second amplifier for receiving as input the second differential amplified signal and generating at an output a differential integrator output; and a summing network coupled to the output of the differential integrator and to the output of the first amplifier, the summing network summing the differential integrator output with the first differential amplified signal for canceling any DC offsets of the first amplifier and the second amplifier;

wherein the control circuit generates a receiver power control signal comprising a receiver ON time interval for turning ON the RF amplifier, mixer and amplifier stage, and a receiver OFF time interval for turning OFF the RF amplifier, mixer and amplifier stage.

DETAILED DESCRIPTION OF THE DRAWINGS

Figure 1:
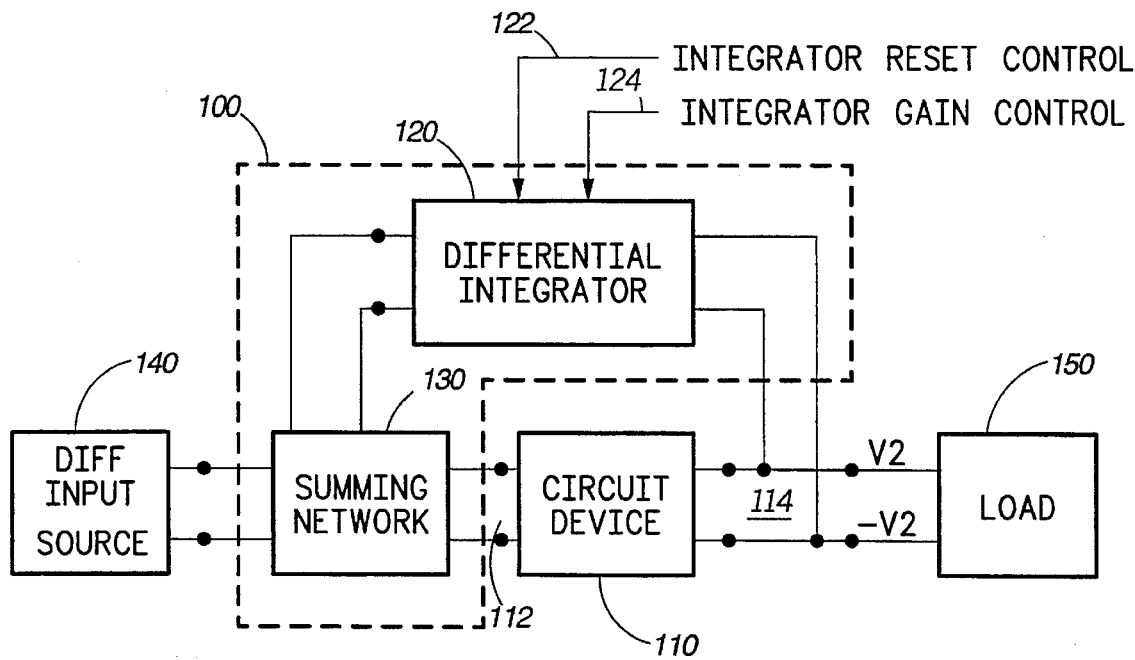
FIG. 1 is an electrical block diagram of differential DC offset compensation circuit according to the present invention.

Referring first to FIG. 1, a general diagram of the differential direct current (DC) offset compensation circuit 100 according to the present invention is illustrated. The circuit 100 comprises a differential integrator 120 and a summing network 130 and provides DC offset compensation for differential DC offsets in a differential input source 140 and in a circuit device 110. The circuit device 110 is one of several types of devices, such as an amplifier, an amplifier-filter, a resistor network, direct connections (short circuits), etc., but nevertheless has a differential input 112 and a differential output 114. The differential input 112 of the circuit device 110 is suitable for coupling to a differential input source 140 of differential input signals and the differential output 114 of the circuit device is suitable for connection to a load 150.

The differential integrator 120 is coupled to the differential output 114 of the circuit device 110 and receives as input, output signals of the circuit device 110, and generates a differential integrator output for canceling any DC offsets of the differential input source 140 and of the circuit device 110. The summing network 130 is coupled to the differential integrator output, to the differential input source 140 and to the differential input 112 of the circuit device 110. The summing network 130 sums the differential integrator output with the differential input signals of the differential input source 140. The summing signals are coupled to the differential input 112 of the circuit device 110. The differential input source 140 takes the form of either differential voltage signals or differential current signals, as the case may be, such as those generated by an amplifier.

The differential integrator 120 comprises an INTEGRATOR RESET CONTROL 122 for an integrator reset feature and an INTEGRATOR GAIN CONTROL 124 for an integrator gain control feature. These features will be described in greater detail hereinafter.

Figure 2:
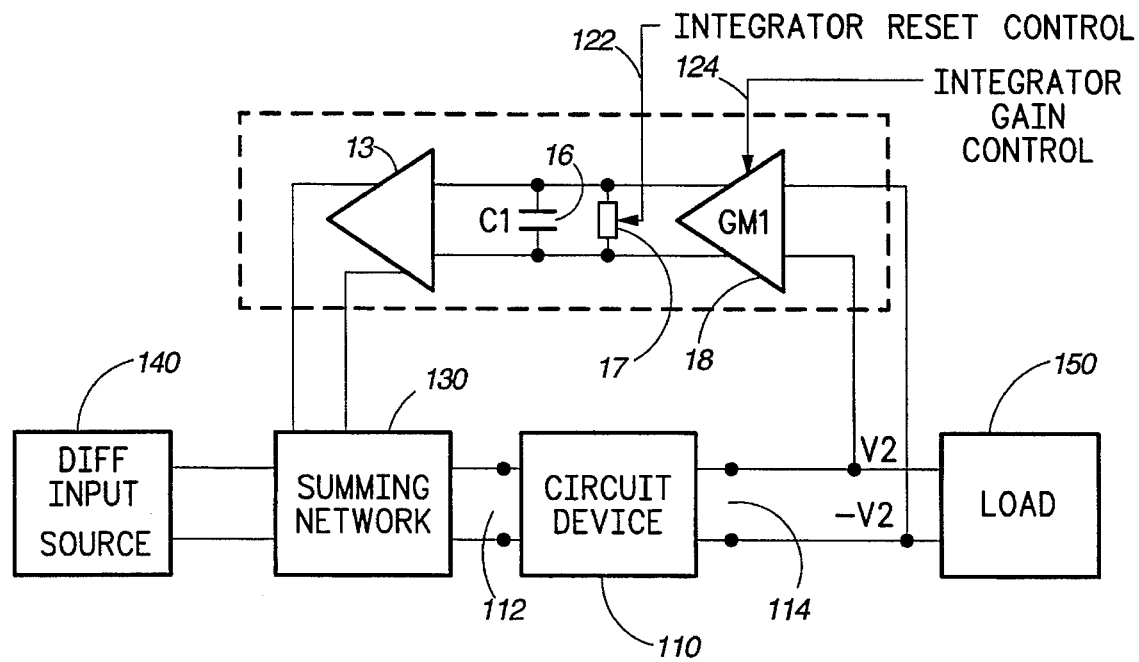
FIG. 2 is a more detailed electrical block diagram of differential DC offset compensation circuit according to the present invention.

Turning now to FIG. 2, the differential integrator 120 comprises a capacitor element 16 having a capacitance of C1 which is connected across the differential outputs of a transconductance amplifier 18, a switch 17 controlled by the INTEGRATOR RESET CONTROL 122 and an amplifier 13. Depending on the nature of the circuit device 110 and the differential input source 140, the amplifier 13 is either a transconductance amplifier designated by the reference numeral 14 or a voltage amplifier designated by the reference numeral 44.

The capacitor 16 of the differential integrator 120 is a "floating" capacitor, and as will become apparent hereinafter, the voltage across the capacitor 16 is used by the summing network to compensate for DC offsets in the differential input source 140 and the circuit device 110. The capacitor 16 is "floating" in the sense that it is connected across the outputs of the transconductance amplifier 18, and not to ground.

Figure 15:
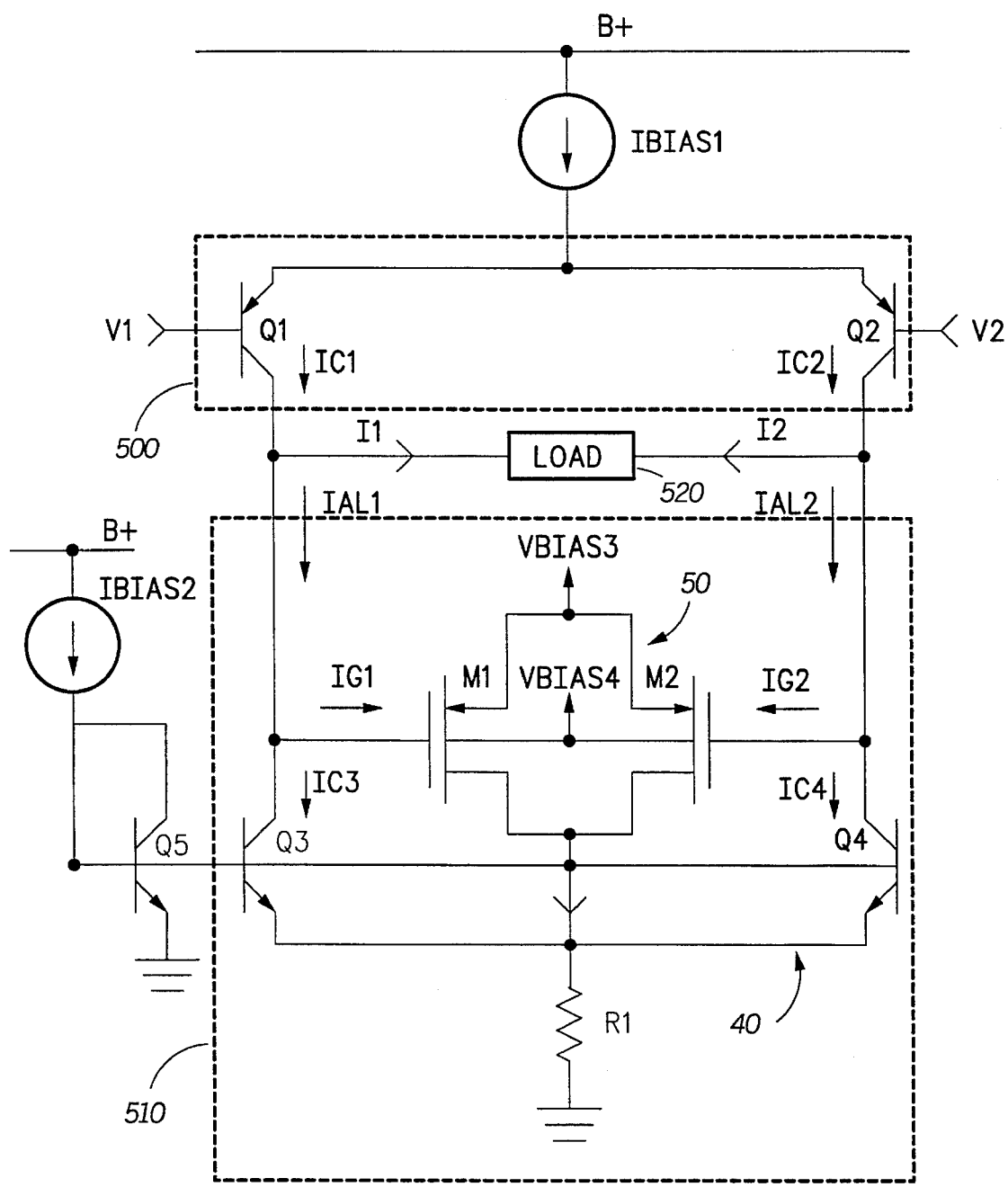
FIG. 15 is an electrical schematic diagram of a transconductance amplifier according to the present invention.

An important element in the differential integrator 120 is the first transconductance amplifier 18 which charges the floating capacitor 16. The gain gm1 of the transconductance amplifier 18 is controlled by INTEGRATOR GAIN CONTROL 124. One example of a suitable transconductance amplifier is shown in FIG. 15, and is disclosed in the aforementioned commonly assigned and co-pending application, entitled Fully Differential Transconductance Amplifier with Common-Mode Output Voltage Stabilization. The transconductance amplifier disclosed in the co-pending application affords a faster warm-up time by isolating the differential-mode operation of the circuit from the common-mode operation. This allows the common-mode transient response to be controlled independently of the differential mode signal frequency response.

Figure 3:
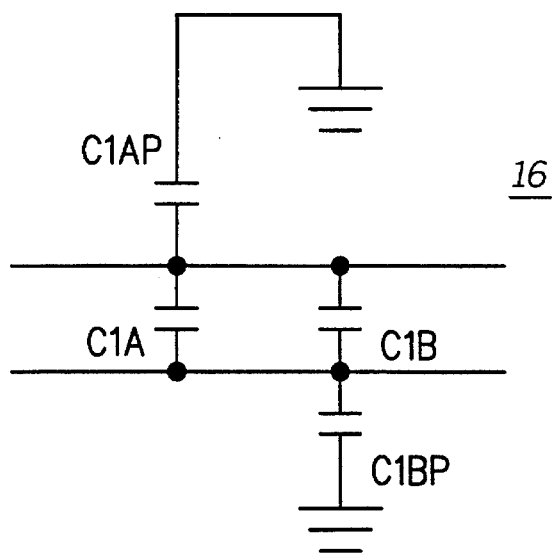
FIG. 3 is an electrical schematic diagram of a capacitor network used in the differential DC offset compensation circuit of the present invention.

Referring to FIG. 3, the capacitor 16 having capacitance of C1 is preferably formed of two capacitors C1A and C1B. Capacitors C1A and C1B are connected in parallel and in opposite directions so that there is an equal parasitic capacitor to ground from each node (C1AP and C1BP). This results in each parasitic capacitor (C1AP or C1BP) being about 5% of the value of the main capacitor C1A+C1B, which allows a much faster warm-up time than that which would be possible if the main capacitor had one terminal grounded. The effective capacitance C1 in the differential-mode in FIG. 3 is given by C1=C1A+C1B+((C1AP)×(C1BP))/(C1AP+C1BP).

Figure 4:
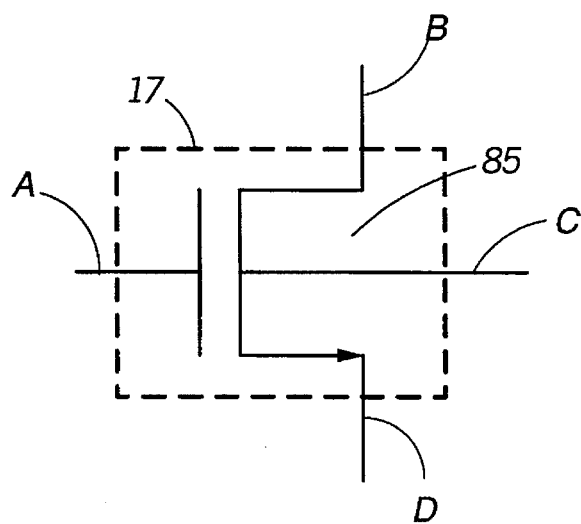
FIG. 4 is an electrical schematic diagram of a switch element in the differential DC offset compensation circuit of the present invention.

FIG. 4 illustrates the switch 17 in greater detail. An example of switch 17 is an NMOS transistor switch 85 is shown in FIG. 4, where b and d are the switch terminals, a is the control input terminal and c is the bulk. For an NMOS transistor the bulk c is normally tied to ground. The gate terminal a is driven by a voltage source (not shown) coupled to the switch 85 via a line conveying an INTEGRATOR RESET CONTROL signal (FIGS. 1 and 2), whereby a low voltage on terminal a (typically ground) turns the transistor switch 85 OFF and a high voltage turns the transistor switch 85 ON. The high voltage level needs to be greater than approximately the sum of the average DC voltages on the two switch terminals plus the MOS transistor gate-source threshold voltage. Turning the switch 17 ON ensures that the voltage across capacitor 16 (FIG. 2) is zero or near zero following power up of the circuit and minimizes the time for circuit stabilization. This effectively resets the differential integrator 120.

Figure 5:
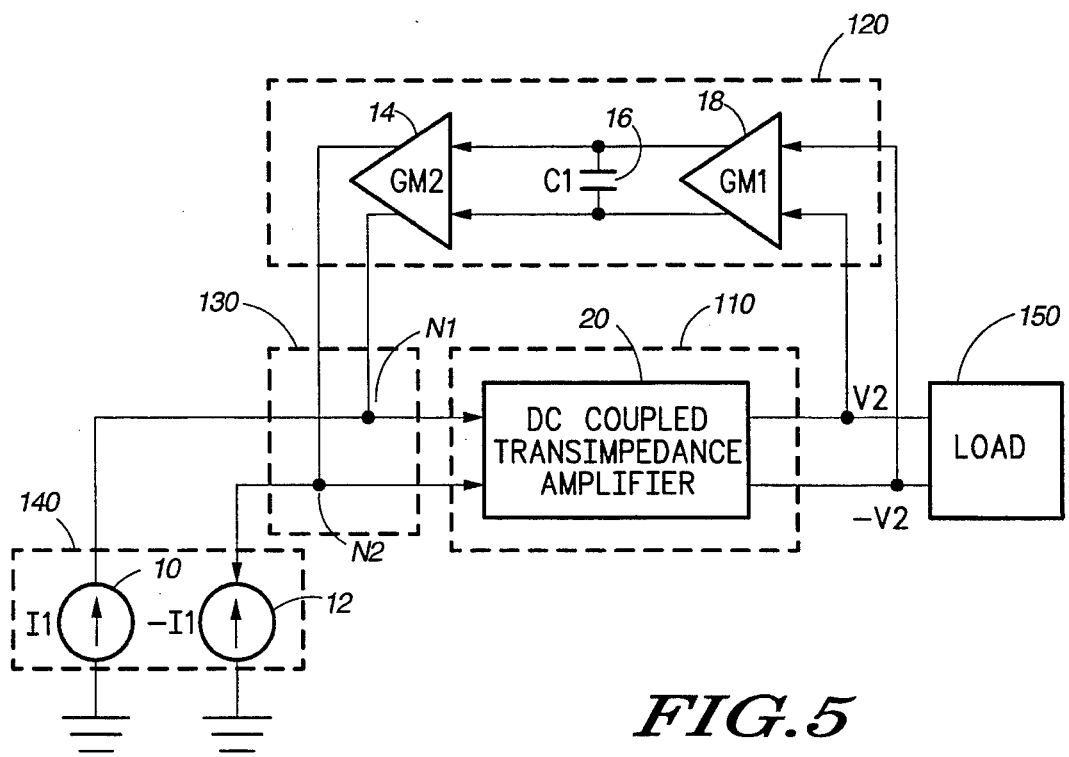
FIG. 5 is an electrical schematic diagram of a differential DC offset compensation circuit according to a first embodiment of the present invention.

FIG. 5 illustrates an example in which the circuit device 110 comprises a DC coupled transimpedance amplifier 20, which as its name implies, amplifies differential current signals and generates differential voltage signals at its output. Consequently, the differential input source 140 is represented by differential current sources 10 and 12. In the differential integrator 120, transconductance amplifier 14 having a gain gm2 is connected across the capacitor 16, which converts the voltage across the capacitor 16 to differential integrator currents by the transconductance amplifier 14. The summing network 130 comprises nodes N1 and N2 into which the differential integrator currents of the differential integrator 120 and the currents of differential current sources 10 and 12 flow, respectively, and thus are added together. The DC coupled transimpedance amplifier 20 receives as input the currents summed by the nodes N1 and N2.

There are several unique features of the compensation circuit shown in FIG. 5. In most amplifiers with differential output voltages, such as the DC coupled transimpedance amplifier 20, it is desirable that the output DC offset voltage be zero or near zero under all conditions, including manufacturing process variations and temperature. A non-zero DC output voltage can be caused by DC offsets in the stages of the DC coupled transimpedance amplifier 20 or in the differential current sources 10 and 12. The DC offsets are canceled by the differential integrator 120 comprising amplifiers 14 and 18, and capacitor C1.

The differential input of transconductance amplifier 18 is connected to and driven from the differential output of DC coupled transimpedance amplifier 20. The input offset voltage of transconductance amplifier 18 determines the accuracy of controlling the DC offset voltage at the output of DC coupled transimpedance amplifier 20. Thus, the transconductance amplifier 18 is best designed to have a low input offset voltage. Transconductance amplifier 18 is a differential input/output transconductance amplifier which utilizes internal feedback to stabilize its common-mode output voltage. The aforementioned co-pending application describes one approach for stabilizing the common-mode operation of transconductance amplifier 18 as well as a technique for trimming the amplifier's input offset voltage to a low value. The common-mode output voltage stabilization of transconductance amplifier 18 allows the floating capacitor C1 to be connected across the output terminals of the amplifier. The differential integrator forces the differential DC offset current at the output of the transconductance amplifier 14 to a value which results in the DC offset voltage at the output of DC coupled transimpedance amplifier 20 to be equal to the input offset voltage of transconductance amplifier 18. Therefore, the desired low DC offset voltage at the output of amplifier 20 is achieved provided that the input offset voltage of amplifier 18 is sufficiently low.

The connections to amplifiers 14, 18 and 20 is such that feedback is negative. The input impedance of transconductance amplifier 14 is sufficiently high that its input bias current does not excessively load the output of transconductance amplifier 18.

An analysis of the frequency response of the DC coupled transimpedance amplifier 20 (with feedback comprising the differential integrator 120) shows that the differential integrator feedback adds a high pass pole to the frequency response. This assumes that other poles are located at frequencies which are much greater than that of the feedback loop high pass pole. For this situation, the transfer function of the DC coupled transimpedance amplifier 20 is given by:

$$V2/I1=Rm\{s/[s+(Rm)(gm1)(gm2)C1]\} \qquad \text{Equation (1)}$$

where Rm=DC gain of transimpedance amplifier 20.

The high pass corner frequency is given by:

$$\omega=(Rm)(gm1)(gm2)/C1 \qquad \text{Equation (2)}$$

From Equation (2), it is noted that the high pass corner frequency is externally programmable by using a variable gain element to implement amplifiers 14, 18 or 20. The capability to control the gain of transconductance amplifier 18 is disclosed in the aforementioned co-pending application, and also described in conjunction with FIG. 15, hereinafter.

Figure 6:
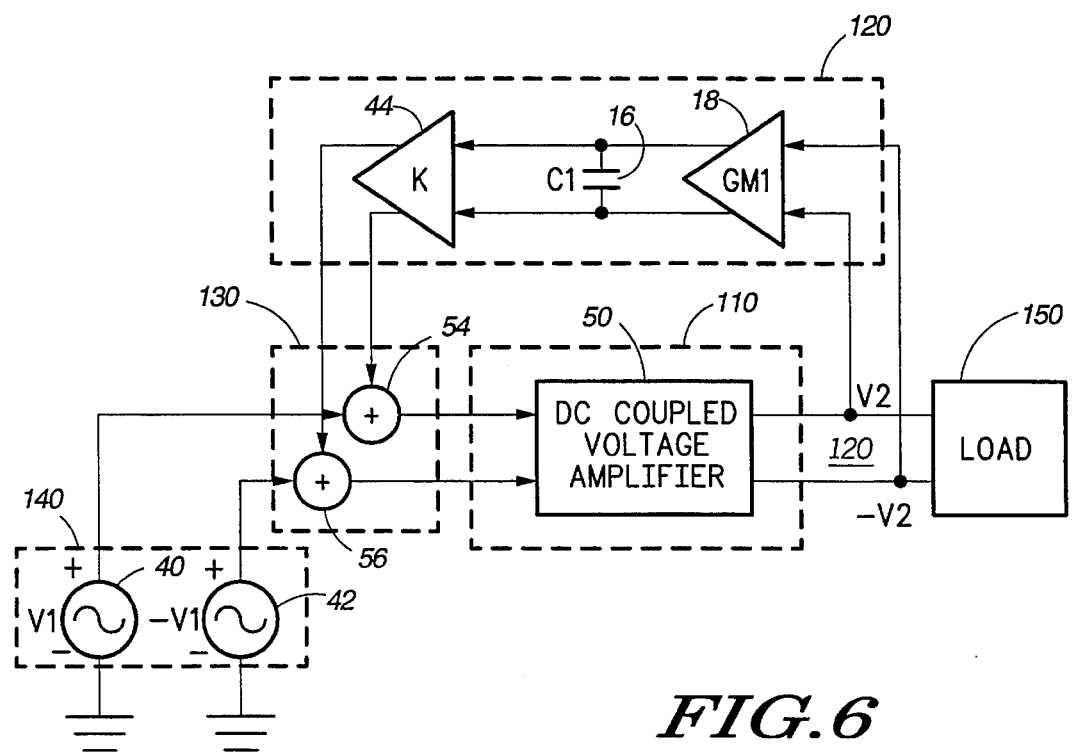
FIG. 6 is an electrical schematic diagram of a differential DC offset compensation circuit according to a second embodiment of the present invention.

Turning now to FIG. 6, an example is illustrated in which the circuit device 110 comprises a DC coupled voltage amplifier 50. Because the DC coupled voltage amplifier 50 operates on voltage, the differential input source 140 is represented by differential voltage sources 40 and 42, the differential integrator 120 comprises a voltage amplifier 44 with gain K, and the summing network 130 comprises adders 54 and 56. The voltage amplifier 44 amplifies the voltage across capacitor 16 and this differential voltage is added to the differential voltage of the differential input source 140 by the adders 54 and 56. The sum signals are applied to the DC coupled voltage amplifier 50.

The transfer function of the DC coupled voltage amplifier 50 at low frequencies is given by:

$$V2/V1=Ka\{s/[s+(K)(Ka)(gm1)C1]\} \qquad \text{Equation (3)}$$

where Ka=DC gain of voltage amplifier 50

K=DC gain of voltage amplifier 44

The high pass corner frequency is given by:

$$\omega=(K)(Ka)(gm1)/C1 \qquad \text{Equation 4}$$

The DC coupled transimpedance amplifier 20 in FIG. 5 and the DC coupled voltage amplifier 50 in FIG. 6 optionally include a low pass filter and the performance improvements described herein are maintained provided that the high pass corner frequency generated by the differential integrator 120 is kept substantially below the low pass corner frequency of the low pass filter in the DC coupled transimpedance amplifier 20 and/or the DC coupled voltage amplifier 50.

FIGS. 7–10 are examples in which the circuit device 110 is not an active device with a gain.

Figure 7:
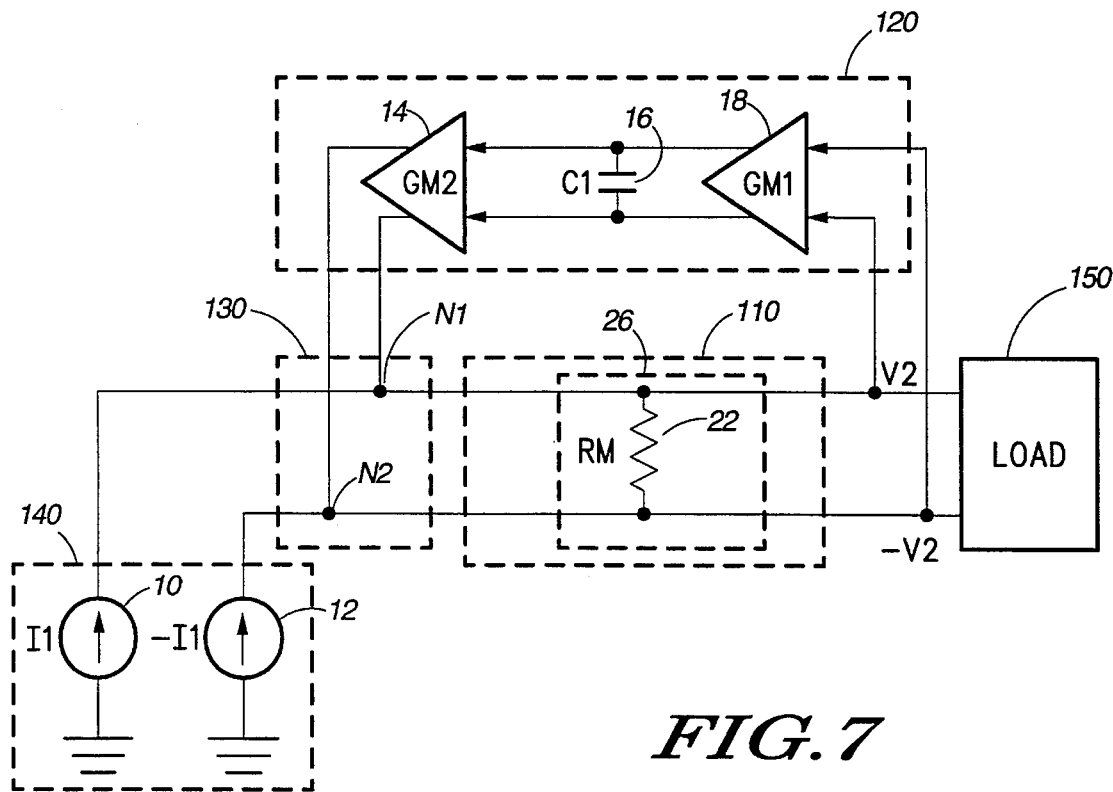
FIG. 7 is an electrical schematic diagram of a differential DC offset compensation circuit according to a third embodiment of the present invention.

First, in FIG. 7 the circuit device 110 is a resistor network 26. The differential input source 140 is represented by differential current sources 10 and 12, and the summing network 130 comprises nodes N1 and N2, much like the configuration of FIG. 5. The summing network 130 adds the differential current output of the transconductance amplifier 14 to the differential current sources 10 and 12. The resistor network 26 comprises a single resistor 22 which generates the differential output voltage which is applied to the load 150. The common-mode output voltage applied to the load 150 is controlled, for example, by implementing transconductance amplifier 14 with a transconductance amplifier of the type shown in FIG. 15 and disclosed in the aforementioned co-pending patent application. Any input resistance of load 150 is assumed absorbed into resistor 22.

Figure 8:
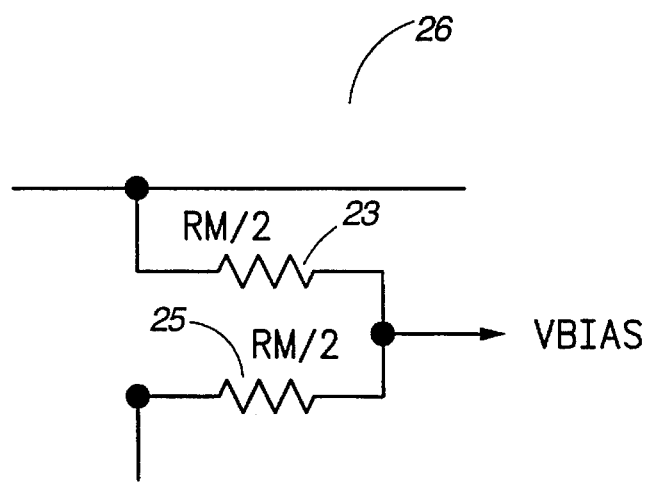
FIG. 8 is an electrical schematic diagram of a resistor network used in the circuit of FIG. 7.

Alternately, to accomplish common-mode biasing, the resistor network 26 in FIG. 7 comprises a bias voltage source VBIAS and two resistors 23 and 25, as shown in FIG. 8. The transfer function and high pass corner frequency of the circuit in FIG. 7 is the same as that for the circuit in FIG. 5.

Figure 9:
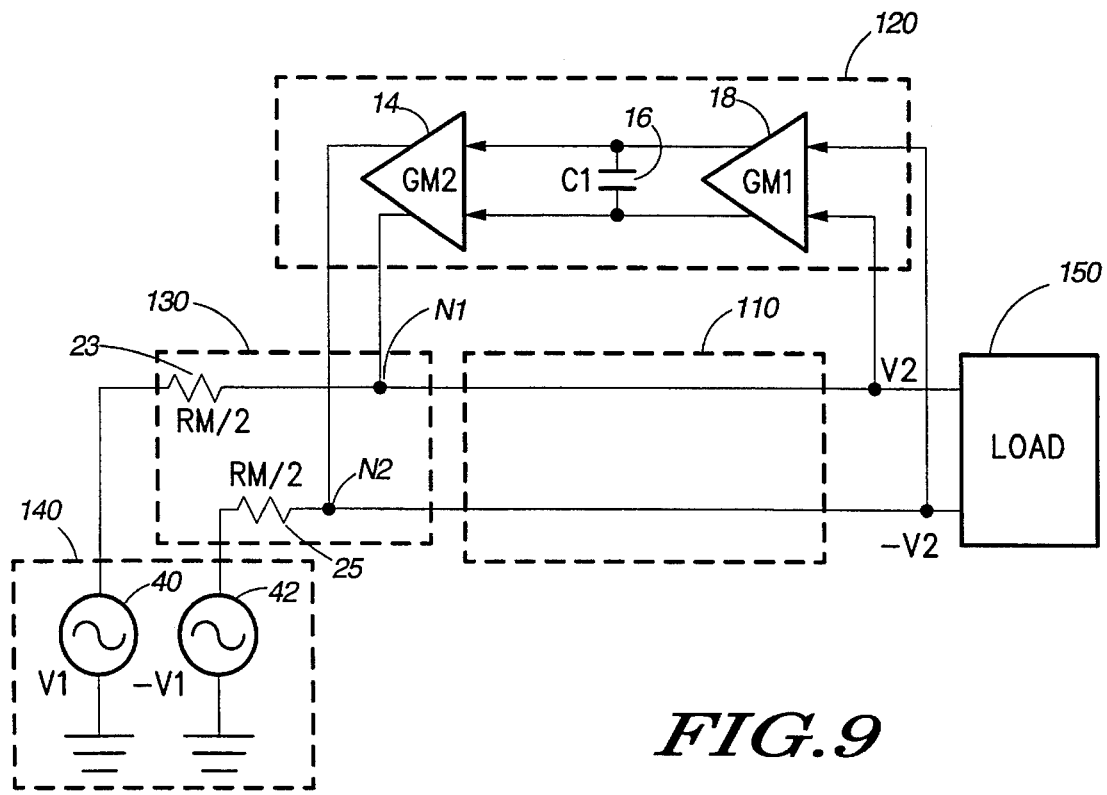
FIG. 9 is an electrical schematic diagram of a differential DC offset compensation circuit according to the fourth embodiment of the present invention.

FIG. 9 illustrates an example in which the circuit device 110 is simply a short-circuit to the load. This configuration is similar to FIG. 7 with the alternative resistor network of FIG. 8, except that resistors 23 and 25 are incorporated in the summing network 130 and the differential input source 140 is represented by differential voltage sources 40 and 42. Resistors 23 and 25 are optionally incorporated into the output circuitry of the differential input source 140 represented by differential voltage sources 40 and 42. The summing network 130 further includes nodes N1 and N2 to add the differential current output by the differential integrator 120 to the currents through resistors 23 and 25, respectively. The transfer function of the circuit in FIG. 9 is given by:

$$V2/V1 = s/[s+(Rm)(gm1)(gm2)/C1] \quad \text{Equation (5)}$$

The high pass corner frequency is given by:

$$\omega = (Rm)(gm1)(gm2)/C1 \quad \text{Equation (6)}$$

Figure 10:
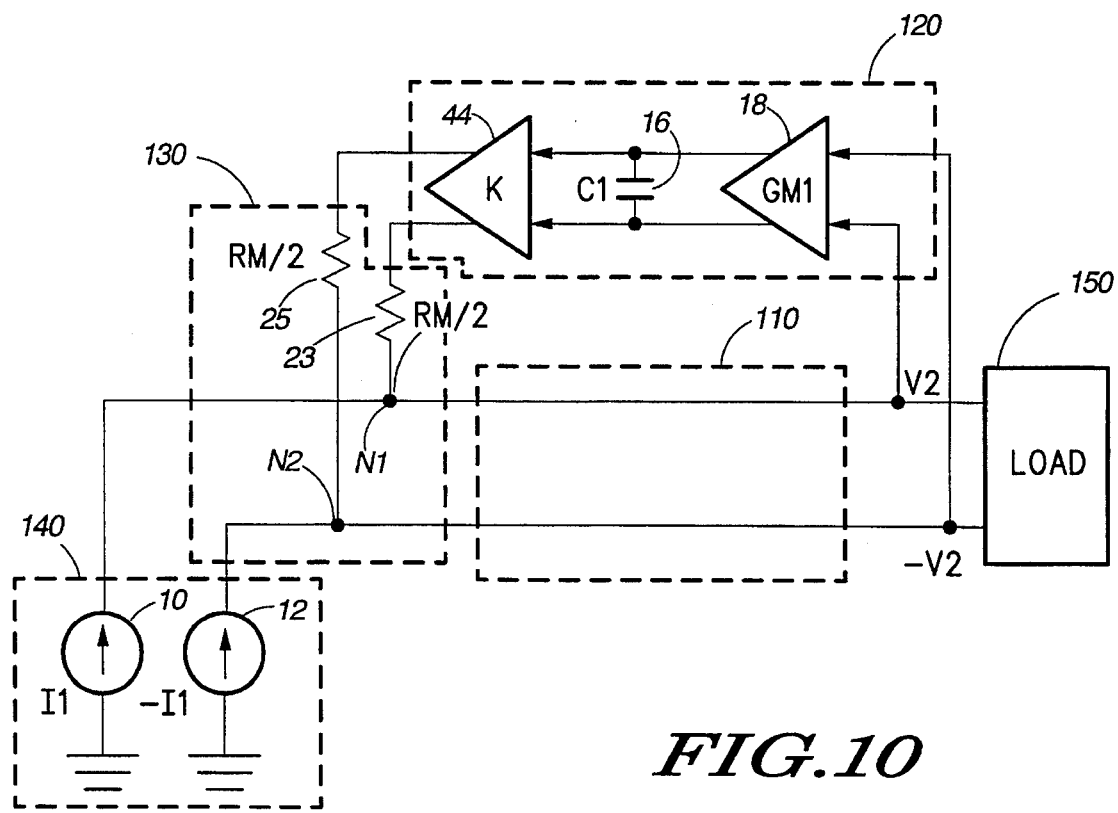
FIG. 10 is an electrical schematic diagram of a differential DC offset compensation circuit according to the fifth embodiment of the present invention.

The circuit in FIG. 10 is similar to FIG. 7, with the alternative resistor network of FIG. 8, except that transconductance amplifier 14 is replaced by voltage amplifier 44 and resistors 23 and 25 are separated and driven by voltage amplifier 44. The differential input source 140 is represented by differential current sources 10 and 12 and the summing network comprises the resistors 23 and 25 as well as the nodes N1 and N2. Optionally, resistors 23 and 25 are incorporated into the output circuitry of voltage amplifier 44. The transfer function of the circuit in FIG. 10 is given by:

$$V2/I1 = Rm\{s/[s+(K)(Rm)(gm1)/C1]\} \quad \text{Equation (7)}$$

The high pass corner frequency is given by:

$$\omega = (K)(Rm)(gm1)/C1 \quad \text{Equation (8)}$$

The compensation circuit of the present invention is useful in any integrated circuit application requiring DC offset voltage compensation, including a differential amplifier or differential amplifier/low pass filter.

It should be understood that the circuits shown in FIGS. 5, 6, 7, 9 and 10 also have INTEGRATOR RESET CONTROL and INTEGRATOR GAIN CONTROL features, as shown in FIGS. 1 and 2, and described in the corresponding portions herein. FIGS. 5, 6, 7, 9 and 10 omit these features for the sake of simplicity, Certain applications of the differential DC offset compensation circuit of the present invention, such as in a receiver circuit of a portable communications device, require that the differential integrator portion of the circuit be strobed ON and OFF frequently. When the circuit according to the present invention is strobed ON and OFF, the warm-up time is very fast when compared to a conventional feedback circuit with a grounded capacitor. The dominant capacitive element in the circuit, capacitor 16, controls the differential-mode response time, but has little effect on the common-mode response time. This results from the fact that the capacitor is floating with approximately the same DC bias voltage on each node and that the capacitor nodes are driven differentially by a completely differential circuit. Under these conditions, both capacitor nodes remain at approximately the same voltage potential during all phases of power down and power up. Therefore, warm-up time is fast because the largest capacitive element in the circuit does not need significant charging or discharging during circuit stabilization.

Figure 11:
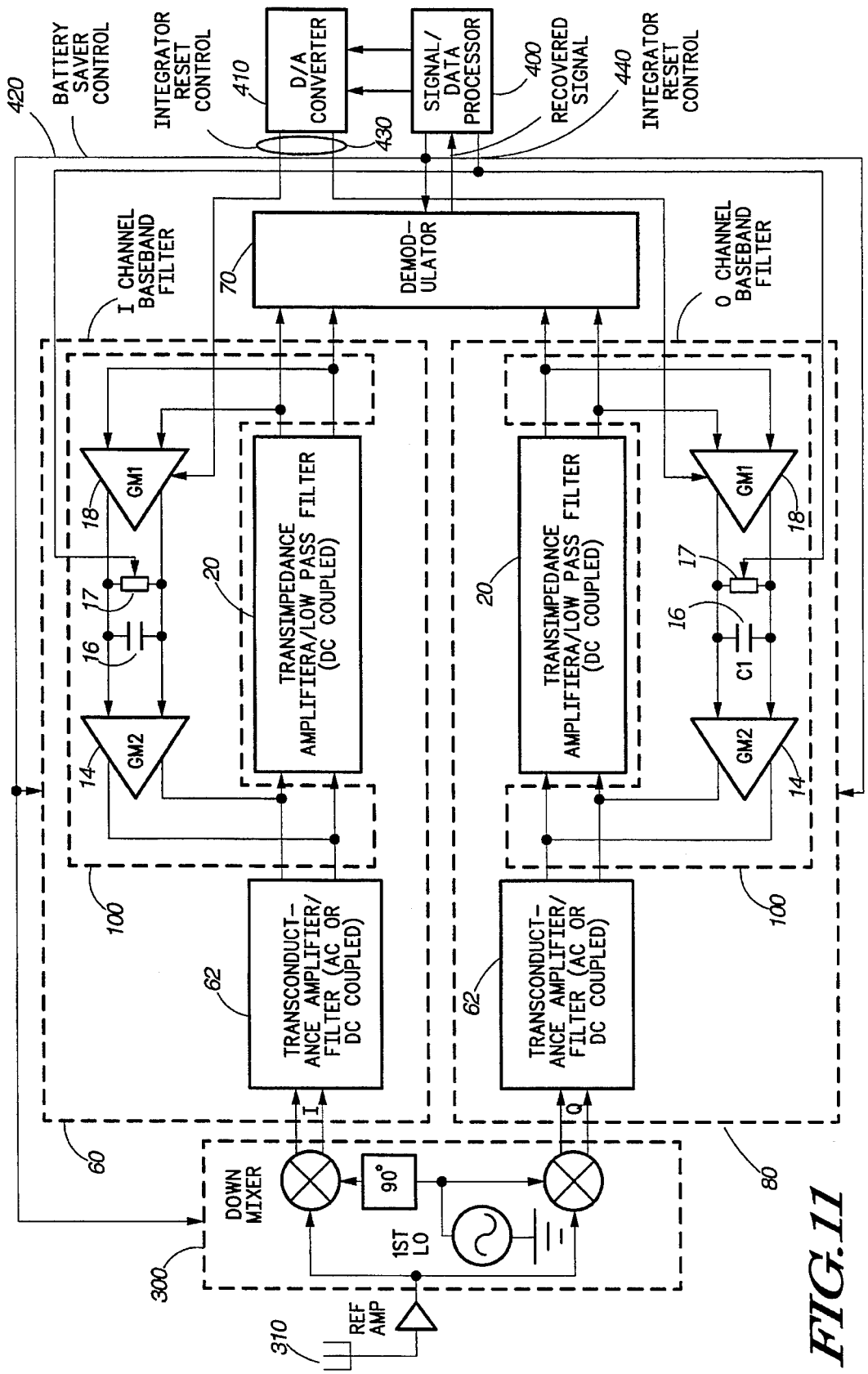
FIG. 11 is an electrical block diagram of a zero-intermediate frequency (zero-IF) receiver circuit having a base band filter utilizing the differential DC offset compensation circuit in accordance with the present invention.

FIG. 11 illustrates an example of an application of a compensation circuit according to the present invention. FIG. 11 is an electrical block diagram of a zero-intermediate frequency (zero-IF) receiver circuit. The zero-IF receiver circuit comprises a front-end radio frequency (RF) amplifier and mixer section 300 which receives an RF signal detected by an antenna 310 and generates quadrature base band signals I and Q, two base band filters 60 and 80 and a demodulator 70. The quadrature base band signals I and Q are supplied to the two base band filters 60 and 80. The two base band filters are of identical design with a DC or AC coupled transconductance amplifier 62 being the differential input source to the transimpedance amplifier 20 in each base band filter 60 and 80. The current output of amplifier 62 drives DC coupled transimpedance amplifier 20, which is DC coupled at its input and output. One or both of the amplifiers 62 or 20 has a low pass filter characteristic. The part of the transconductance amplifier 62 that is DC coupled to its output is compensated by the compensation circuit 100 according to the present invention.

In each base band filter 60 and 80, a differential DC offset compensation circuit 100 is inserted, each of which comprises a differential integrator each consisting of transconductance amplifiers 14 and 18 and capacitor 16. The differential integrator forces the DC offset voltage at the differential output of the base band filters 60 and 80 for the I and Q channels, respectively, to zero or near zero. Since all of the elements in the two differential integrators, including the capacitors, are completely integrated, IC pin-outs and external parts are minimized.

The output of each DC coupled transimpedance amplifier 20 drives the demodulator 70. The demodulator 70 is, for example, implemented using the well known Barber receiver approach where up-mixers convert the base band filter output signals to a higher frequency for conventional demodulation. If the Barber approach is taken, the differential integrators ensure that the differential base band signals applied to the up-mixers have the near zero DC offset that is required for optimum operation of DC coupled mixers. Other approaches, such as cross-product demodulators which accept I and Q base band signals, are also useful to implement the demodulator 70.

The recovered signal from the demodulator 70 is applied to the signal/data processor 400. The signal/data processor 400 contains a battery saver routine for turning ON and OFF the receiver via a BATTERY SAVER CONTROL signal supplied to the receiver circuit via line 420. All amplifiers and filters in base band filters 60 and 80 except transconductance amplifier 18 are turned ON and OFF with the BATTERY SAVER CONTROL signal.

The differential DC offset compensation circuit 100 in each of the channels has a separate INTEGRATOR GAIN CONTROL and INTEGRATOR RESET CONTROL as explained above in connection with FIGS. 1 and 2. Signal lines 430 couple signals generated by the signal/data processor 400 via D/A converter 410, in the case of the INTEGRATOR GAIN CONTROL, to the transconductance amplifier 18 in each of the channels. Signal line 440 couples signals generated by the signal/data processor 400 to the switch 17 in each of the channels, for effecting INTEGRATOR RESET CONTROL.

The INTEGRATOR GAIN CONTROL sets the biasing current for enabling and controlling the gain of amplifier 18 or disabling the amplifier as described in the aforementioned co-pending application, and referred to hereinafter in connection with FIG. 15. In the simplest implementation, INTEGRATOR GAIN CONTROL has 2 states, zero biasing current into amplifier 18 (disabled) or a fixed current for setting a single high pass corner frequency in the base band filters. In this case the D/A converter 410 is implemented, for example, with a single resistor for each base band filter channel. If transconductance amplifiers 18 are to be always turned ON and OFF in synchronization with the BATTERY SAVER CONTROL signal and only one base band filter high pass corner frequency is desired, the INTEGRATOR GAIN CONTROL can be eliminated and the transconductance amplifier 18 driven directly from the BATTERY SAVER CONTROL signal. This mode of operation assumes that a resistor or other circuitry is used to convert the BATTERY SAVER CONTROL signal to the appropriate bias current for setting the gain of each transconductance amplifier 18 to provide the desired high pass corner frequency.

In other implementations, the signal/data processor 400 programs, for example, the biasing current to transconductance amplifier 18 to set multiple high pass corner frequencies in the base band filters 60 and 80. This frequency programmability allows the receiver sensitivity to be optimized for signaling protocols with different frequency deviations by tailoring the base band filter high pass corner frequency to the minimum frequency deviation of the protocol. In this manner, the signal/data processor 400 serves as a control circuit for controlling the operation of the accompanying receiver circuit.

As shown in FIG. 11, the signal/data processor 400 has the capability to turn ON and OFF switch 17 in base band filters 60 and 80 via the line 440. The switch 17 is connected in parallel with the capacitor 16 in each of the base band filters 60 and 80 and when turned ON, provides a low resistance path and discharges the capacitor 16. This effectively resets the integrator output to zero.

The differential DC offset compensation circuit 100 according to the present invention is useful in other portions of the receiver circuit, and particularly any amplifier stage of the receiver circuit where it is desirable to cancel DC offsets.

Base band filters 60 and 80 including the compensation circuit 100 according to the present invention, are strobed ON and OFF in order to save battery power, for example, in the receiver circuit of a portable communications receiver. To this end, there are several ways to improve the warm-up time of the circuits in the base band filters 60 and 80 during the strobed operation, thereby reducing receiver ON time.

Figure 12:
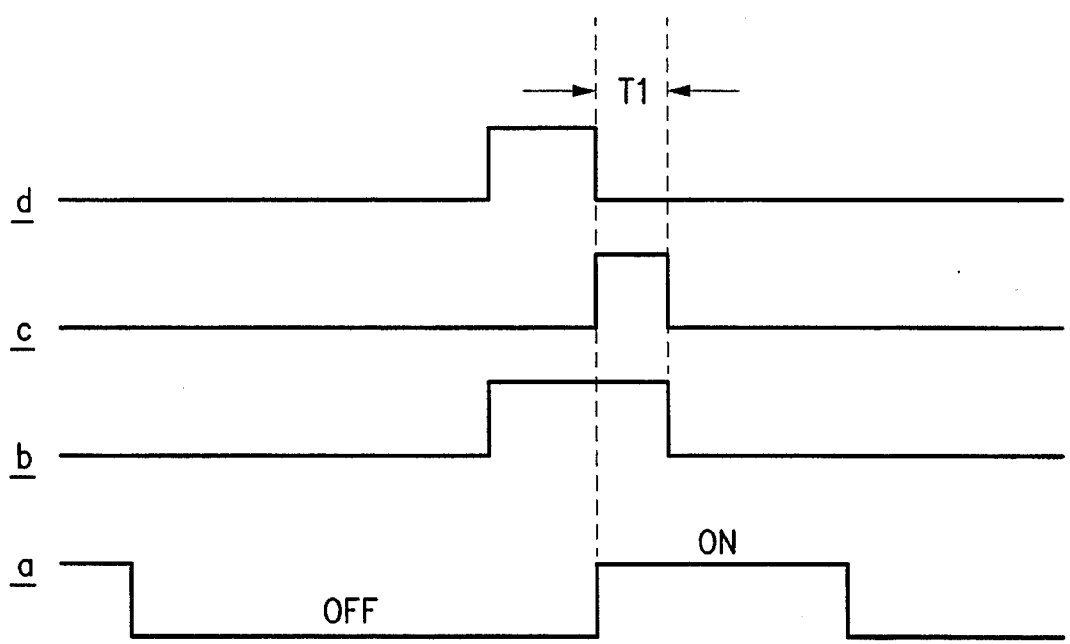
FIGS. 12, 13 and 14 are control signal timing diagrams according to the present invention.

First, turning the switch 17 ON by using the INTEGRATOR RESET CONTROL during the last portion of the power OFF interval of the receiver ensures that the voltage across capacitor 16 is zero or near zero following power up of the circuit and minimizes the time for circuit stabilization. This variation might also be desirable in applications where IC leakage currents are sufficiently high to develop a voltage across capacitor 16 during the power OFF interval. Turning the switch 17 ON during the beginning of the power ON interval and OFF during the remainder of the interval prevents any power up transients from developing a voltage across the capacitor and increasing stabilization time. These warm-up time enhancements are illustrated in FIG. 12 where timing waveform a represents the BATTERY SAVER CONTROL signal for turning the receiver ON and OFF. Timing waveforms b, c, and d represent three possible signal waveforms for the INTEGRATOR RESET CONTROL described above. The time interval T1 is chosen to be greater than or equal to the time required for receiver power up transients to dissipate.

In FIG. 12, the BATTERY SAVER CONTROL signal comprises an OFF interval and an ON interval. Waveform d represents integrator reset just prior to the time instant at which the receiver ON interval begins, and for a duration until the beginning of the receiver ON interval. Waveform c represents integrator reset substantially coincident with the beginning of the receiver ON interval and for a predetermined period of time thereafter. Waveform b represents combining the attributes of waveforms c and d.

As an example, for a selective call receiver responsive to a paging protocol, the receiver OFF time interval is one second in duration, up to 4 minutes. The time interval T1 is, for example, 10 to 100 milliseconds. The receiver ON time interval varies for a selective call receiver, depending on whether the address in a received signal matches that of the selective call receiver.

Figure 13:
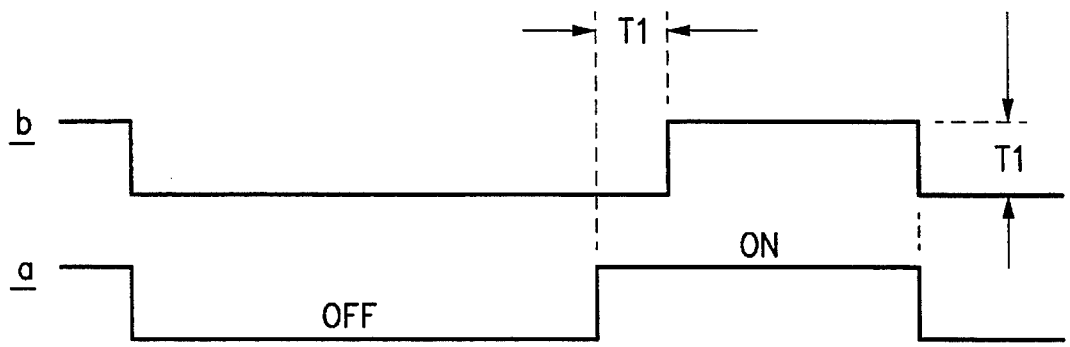

A second example of a way to improve warm-up time of the base band filters is to delay enabling transconductance amplifier 18 for an interval following power up until all power up transients have settled. The high impedance state present at the output of the transconductance amplifier 18 prevents the voltage stored on capacitor 16 from being corrupted by the power up transient. This warm-up time improvement is shown in FIG. 13 where timing waveform a represents the BATTERY SAVER CONTROL signal, timing waveform b represents the biasing current signal waveform of the INTEGRATOR GAIN CONTROL applied to transconductance amplifiers 18 in base band filters 60 and 80. The time interval T1 is chosen to be greater than or equal to the time required for receiver power up transients to dissipate. The biasing current amplitude I1 is set to provide the desired high pass corner frequency in base band filters 60 and 80, as previously described.

A third example is to increase the gain of the transconductance amplifier 18 to a higher than normal level during the beginning of the power ON interval for a short duration to allow capacitor C1 and any parasitic capacitances to be more quickly charged. This occurs because of the higher bias currents in transconductance amplifier 18 during the high gain condition. The gain of transconductance amplifier 18 is then reduced for the remainder of the power ON interval to a normal level which gives the desired high pass corner frequency in base band filters 60 and 80. Alternatively, the gain of the transconductance amplifier 18 is left at zero during the power up transient portion of the power ON interval and then increased to a higher than normal level for a short duration to allow capacitor C1 and any parasitic capacitances to be quickly charged. The gain of transconductance amplifier 18 is then reduced for the remainder of the power ON interval to a normal level which gives the desired high pass corner frequency in base band filters 60 and 80.

Figure 14:
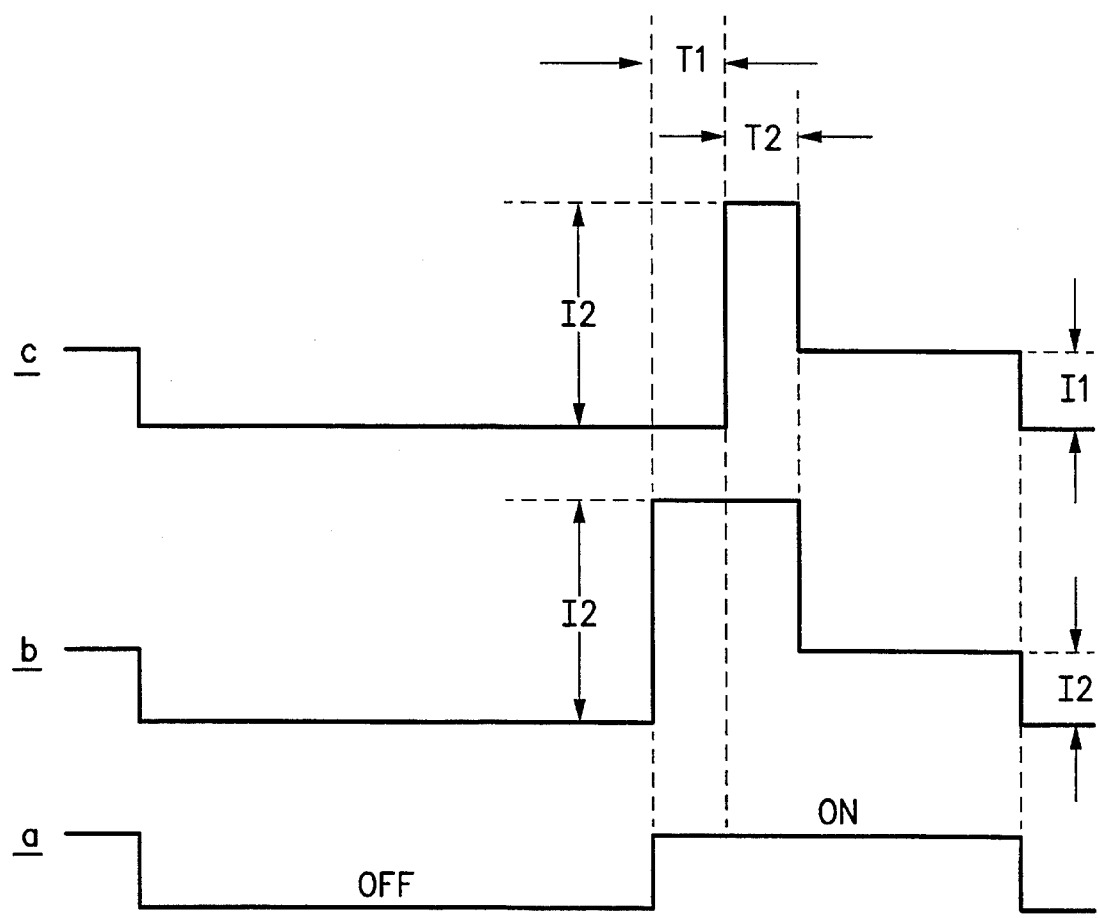

These warm-up enhancements are illustrated in FIG. 14 where timing waveform a represents the BATTERY SAVER CONTROL signal, timing waveforms b and c represent two possible biasing current signal waveforms for the INTEGRATOR GAIN CONTROL applied to transconductance amplifiers 18 in base band filters 60 and 80. The time interval T1 represents the time required for receiver power up transients to dissipate. The normal biasing current amplitude I1 is set to provide the desired high pass corner frequency in base band filters 60 and 80, as indicated by Equation (2) above. The higher than normal biasing current I2 is set to charge capacitor 16 and any parasitic capacitances quickly. Time T2 is selected so that for the chosen value of I2, the voltages on the nodes of capacitor 16 are completely stabilized at the end of the interval.

FIG. 15 illustrates an example of transconductance amplifier 18, which is also disclosed in the aforementioned co-pending application. Specifically, the transconductance amplifier 18 comprises a bipolar differential amplifier 500 and an active load circuit 510 for the bipolar differential amplifier 500. The transconductance amplifier 18 is suitable for driving a load 520, which is capacitor C1 in the present invention.

The differential inputs V1 and V2 of the first bipolar differential amplifier 500 are the differential amplifier inputs suitable for connection to a source of differential voltage signals, such as the output of the circuit device 110 shown in FIG. 1. The outputs of the transconductance amplifier 18 are the differential output currents I1 and I2 and are suitable for connection to the load 520.

The bipolar differential amplifier 500 comprises transistors Q1 and Q2 and is biased by current source IBIAS1 having an input coupled to the voltage supply B+ and an output connected to the emitters of transistors Q1 and Q2. Though not shown, bias adjusting resistors are optionally inserted in the emitter circuits of the transistors Q1 and Q2. As mentioned above, the input to the bipolar differential amplifier 500 are voltages V1 and V2. The output of the bipolar differential amplifier 500 are the collector currents IC1 and IC2.

The active load circuit 510 comprises a second bipolar differential amplifier 540, a metal-oxide-silicon (MOS) differential amplifier 550, and a resistor R1. The second bipolar differential amplifier 540 comprises transistors Q3 and Q4, and the inputs to the bipolar differential amplifier 540 are the bases of the transistors Q3 and Q4. A second bias source is coupled to the bases of the transistors Q3 and Q4. In FIG. 15, the second bias source comprises the diode-configured transistor Q5 and current source IBIAS2. However, voltage bias sources are optionally used for biasing transistors Q3 and Q4 as disclosed in the co-pending application. Diode-connected transistor Q5 and transistors Q3 and Q4 form a current mirror whose gain is adjustable by controlling the voltage drop across resistor R1. A second diode-configured transistor is optionally provided to separately bias transistor Q4, as is disclosed in the aforementioned co-pending application.

The MOS differential amplifier 550 comprises, for example, p-type MOS transistors M1 and M2 which are biased by voltage bias sources VBIAS3 and VBIAS4. VBIAS3 is for example, provided by the voltage supply B+. The voltage bias source VBIAS3 is connected to the source of transistors M1 and M2, and the voltage bias source VBIAS4 is connected to the bulk of the transistors M1 and M2. A bias adjusting resistor is optionally inserted between the voltage bias sources VBIAS3 and the sources of the transistors M1 and M2. The MOS differential amplifier 550 has inputs at the gates of the transistors M1 and M2 and outputs at the drains of the transistors M1 and M2, respectively. Current flowing into the gates of the transistors M1 and M2 are designated currents IG1 and IG2, respectively. The drains of the transistors M1 and M2 are connected in common to resistor R1 and to the emitters of transistors Q3 and Q4. The active load circuit 510 generates active load currents IAL1 and IAL2.

The transfer function of the transconductance amplifier 18 shown in FIG. 15 is:

$$gm = (I2-I1)/(V2-V1) = -(qIBIAS1)/4kT$$

where, k=Boltzmann's constant;

T=Temperature in degrees Kelvin; and q=Electron charge.

Figure 16:
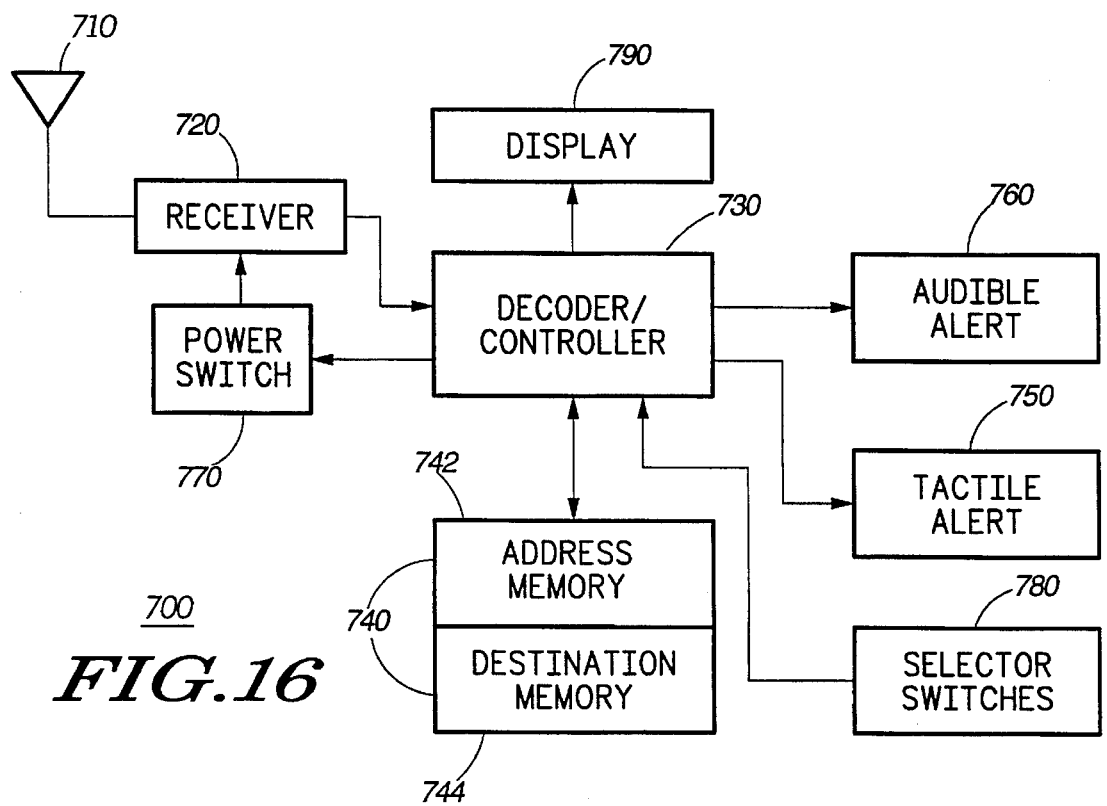
FIG. 16 is an electrical block diagram of a selective call receiver in accordance with the present invention.

FIG. 16 is an example of a use of the circuit according to the present invention in a selective call receiver 700. The selective call receiver 700 comprises an antenna 710, a receiver circuit 720, a decoder/controller 730, and a code plug memory 740 including an address memory 742 and a destination memory 744. The code plug memory 740 is programmable by a remote programming device, as is well known in the art. In addition, various alert devices are provided, such as the tactile alert 750 and the audible alert 760. A power switch 770 is also provided to activate and de-activate certain components of the selective call receiver 700 under control of the decoder/controller 730. The receiver circuit 720 is a receiver circuit such as that shown in FIG. 11, for example, and includes the amplifier circuit according to the present invention in base band filters thereof, such as base band filters 60 and 80.

User input into the selective call receiver is by way of selector switches 780. A menu of various user programmable features is accessed via the switches, through the use of menu information displayed on the display 790.

The above description is intended by way of example only and is not intended to limit the present invention in any way except as set forth in the following claims.

What is claimed is:

1. In combination, a receiver circuit for receiving a signal detected by an antenna, and a control circuit for controlling ON and OFF time of the receiver circuit, the receiver circuit comprising:

a radio frequency (RF) amplifier coupled to the antenna for amplifying the signal detected by the antenna and generating an amplified signal;

a mixer coupled to the RF amplifier for mixing the amplified signal with an oscillator signal of a predetermined frequency and generating at an output a mixed signal;

an amplifier stage coupled to the mixer comprising:
a first amplifier coupled to the output of the mixer for amplifying the mixed signal and generating at an output a first differential amplified signal;
a second amplifier DC coupled to the output of the first amplifier and having a predetermined frequency pass characteristic for amplifying the differential amplified signal and for generating at an output a second differential amplified signal;
a differential integrator coupled to the output of the second amplifier for receiving as input the second differential amplified signal and generating at an output a differential integrator output; and
a summing network coupled to the output of the differential integrator and to the output of the first amplifier, the summing network summing the differential integrator output with the first differential amplified signal for canceling any DC offsets of the first amplifier and the second amplifier;

wherein the control circuit generates a receiver power control signal comprising a receiver ON time interval for turning ON the RF amplifier, mixer and amplifier stage, and a receiver OFF time interval for turning OFF the RF amplifier, mixer and amplifier stage.

2. The combination of claim 1, wherein the second amplifier of the amplifier stage is a transimpedance amplifier having a low pass filter characteristic.

3. The combination of claim 1, wherein the first amplifier of the amplifier stage is a transconductance amplifier.

4. The combination of claim 1, wherein the differential integrator comprises an integrator reset, and wherein the control circuit generates an integrator reset control signal for resetting the differential integrator beginning a predetermined time period prior to an end of the receiver OFF time interval, and ending at a beginning of the receiver ON time interval.

5. The combination of claim 1, wherein the differential integrator comprises an integrator reset, and wherein the control circuit generates an integrator reset control signal for resetting the differential integrator for a predetermined time period beginning at the receiver ON time interval.

6. The combination of claim 1, wherein the differential integrator comprises an integrator reset, and wherein the control circuit generates an integrator reset control signal for resetting the differential integrator for a predetermined time period beginning prior to an end of the receiver OFF time interval, and ending a predetermined time period after a beginning of the receiver ON time interval.

7. The combination of claim 1, wherein the differential integrator has an adjustable integrator gain, and wherein the control circuit generates an integrator gain control signal for setting the adjustable integrator gain to a predetermined value for a predetermined time period beginning after a start of the receiver ON time interval.

8. The combination of claim 1, wherein the differential integrator has an adjustable integrator gain, and wherein the control circuit generates an integrator gain control signal for setting the adjustable integrator gain to a first value for a first predetermined period of time beginning after a start of the receiver ON time interval, and for setting the adjustable integrator gain to a second value lower than the first value for a remainder of the receiver ON time interval.

9. The combination of claim 1, wherein the differential integrator has an adjustable integrator gain, and wherein the control circuit generates an integrator gain control signal for setting the adjustable integrator gain to a first value for a first predetermined period of time beginning at a start of the receiver ON time interval, and for setting the adjustable integrator gain to a second value lower than the first value for a remainder of the receiver ON time interval.

10. The combination of claim 1, and further comprising a demodulator coupled to the output of the second amplifier for demodulating the second differential amplified signal.

11. A selective call receiver comprising the combination of claim 10.

12. In combination, a receiver circuit for receiving a signal detected by an antenna, and a control circuit for controlling ON and OFF time of the receiver circuit, the receiver circuit comprising:

a radio frequency (RF) amplifier coupled to the antenna for amplifying the signal detected by the antenna and generating an amplified signal;

a mixer coupled to the RF amplifier for mixing the amplified signal with an oscillator signal of a predetermined frequency and generating at an output a mixed signal;

an amplifier stage coupled to the mixer comprising:

an amplifier coupled to the output of the mixer for amplifying the mixed signal and generating at an output a differential amplified signal;

a differential integrator coupled to the output of the amplifier for receiving as input the differential amplified signal and generating at an output a differential integrator output; and a summing network coupled to the output of the differential integrator and to the output of the amplifier, the summing network summing the differential integrator output with the differential amplified signal for canceling any DC offsets of the amplifier;

wherein the control circuit generates a receiver power control signal comprising a receiver ON time interval for turning ON the RF amplifier, mixer and amplifier stage, and a receiver OFF time interval for turning OFF the RF amplifier, mixer and amplifier stage.

13. The combination of claim 12, wherein the amplifier of the amplifier stage is a transconductance amplifier.

14. The combination of claim 12, wherein the differential integrator comprises an integrator reset, and wherein the control circuit generates an integrator reset control signal for resetting the differential integrator beginning a predetermined time period prior to an end of the receiver OFF time interval, and ending at a beginning of the receiver ON time interval.

15. The combination of claim 12, wherein the differential integrator comprises an integrator reset, and wherein the control circuit generates an integrator reset control signal for resetting the differential integrator for a predetermined time period beginning at the receiver ON time interval.

16. The combination of claim 12, wherein the differential integrator comprises an integrator reset, and wherein the control circuit generates an integrator reset control signal for resetting the differential integrator for a predetermined time period beginning prior to an end of the receiver OFF time interval, and ending a predetermined time period after a beginning of the receiver ON time interval.

17. The combination of claim 12, wherein the differential integrator has an adjustable integrator gain, and wherein the control circuit generates an integrator gain control signal for setting the adjustable integrator gain to a predetermined value for a predetermined time period beginning after a start of the receiver ON time interval.

18. The combination of claim 12, wherein the differential integrator has an adjustable integrator gain, and wherein the control circuit generates an integrator gain control signal for setting the adjustable integrator gain to a first value for a first predetermined period of time beginning after a start of the receiver ON time interval, and for setting the adjustable integrator gain to a second value lower than the first value for a remainder of the receiver ON time interval.

19. The combination of claim 12, wherein the differential integrator has an adjustable integrator gain, and wherein the control circuit generates an integrator gain control signal for setting the adjustable integrator gain to a first value for a first predetermined period of time beginning at a start of the receiver ON time interval, and for setting the adjustable integrator gain to a second value lower than the first value for a remainder of the receiver ON time interval.

20. The combination of claim 12, and further comprising a demodulator coupled to the output of the amplifier for demodulating the differential amplified signal.

21. A selective call receiver comprising the combination of claim 20.

* * * * *